(12) United States Patent
Nakaya

(10) Patent No.: US 9,834,102 B2
(45) Date of Patent: Dec. 5, 2017

(54) IN-VEHICLE POWER SUPPLY DEVICE

(71) Applicant: Panasonic Intellectual Property Management Co., Ltd., Osaka (JP)

(72) Inventor: Satoshi Nakaya, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 437 days.

(21) Appl. No.: 14/402,169

(22) PCT Filed: May 21, 2013

(86) PCT No.: PCT/JP2013/003234
§ 371 (c)(1),
(2) Date: Nov. 19, 2014

(87) PCT Pub. No.: WO2013/175772
PCT Pub. Date: Nov. 28, 2013

(65) Prior Publication Data
US 2015/0183329 A1    Jul. 2, 2015

(30) Foreign Application Priority Data

May 25, 2012  (JP) ................................ 2012-119668
May 25, 2012  (JP) ................................ 2012-119669

(51) Int. Cl.
*B60L 11/18* (2006.01)
*H01L 31/02* (2006.01)
(Continued)

(52) U.S. Cl.
CPC ....... *B60L 11/1811* (2013.01); *B60L 11/1803* (2013.01); *B60L 11/185* (2013.01);
(Continued)

(58) Field of Classification Search
CPC .............. B60L 11/1803; B60L 11/1811; B60L 11/1816; B60L 11/1824; B60L 11/1846;
(Continued)

(56) References Cited

U.S. PATENT DOCUMENTS

| 5,726,505 A | 3/1998 | Yamada et al. |
| 2011/0204720 A1* | 8/2011 | Ruiz ................... B60L 11/1816 307/66 |

(Continued)

FOREIGN PATENT DOCUMENTS

| EP | 2369712 A1 | 9/2011 |
| EP | 2 587 623 A1 | 5/2013 |

(Continued)

OTHER PUBLICATIONS

Supplementary European Search Report for Application EP 13793529.2 dated Aug. 27, 2015.

(Continued)

*Primary Examiner* — Rexford Barnie
*Assistant Examiner* — Elim Ortiz
(74) *Attorney, Agent, or Firm* — Pearne & Gordon LLP

(57) ABSTRACT

Provided is an in-vehicle power supply device that ensures safety and meets the standards required by the regulation associated with a high voltage, without requiring a large change in the in-vehicle power supply device when outputting DC electric energy stored in a storage battery mounted on a vehicle to the outside of the vehicle, and also provided is a photovoltaic power generation device. In the in-vehicle power supply device, when controlling a switching unit (112) so that a second DC voltage output from a DC/DC converter (111) is output to a DC voltage outlet (103), a vehicle-side control unit (107) controls the DC/DC converter (111) so that the second DC voltage becomes smaller (Continued)

than or equal to a predetermined voltage value that is smaller than the rated voltage value of a storage battery (106).

10 Claims, 7 Drawing Sheets

(51) Int. Cl.
| | |
|---|---|
| *H02J 3/32* | (2006.01) |
| *H02J 3/38* | (2006.01) |
| *H02J 7/35* | (2006.01) |
| *H02S 40/38* | (2014.01) |
| *H02S 40/34* | (2014.01) |
| *H02J 7/00* | (2006.01) |
| *H02M 3/02* | (2006.01) |
| *H02M 7/44* | (2006.01) |

(52) U.S. Cl.
CPC ....... *B60L 11/1816* (2013.01); *B60L 11/1824* (2013.01); *B60L 11/1846* (2013.01); *B60L 11/1848* (2013.01); *H01L 31/02021* (2013.01); *H02J 3/32* (2013.01); *H02J 3/381* (2013.01); *H02J 3/383* (2013.01); *H02J 7/007* (2013.01); *H02J 7/35* (2013.01); *H02M 3/02* (2013.01); *H02M 7/44* (2013.01); *H02S 40/34* (2014.12); *H02S 40/38* (2014.12); *B60L 2210/10* (2013.01); *B60L 2210/30* (2013.01); *B60L 2230/22* (2013.01); *Y02E 10/563* (2013.01); *Y02E 60/721* (2013.01); *Y02E 70/30* (2013.01); *Y02T 10/7005* (2013.01); *Y02T 10/7088* (2013.01); *Y02T 10/7094* (2013.01); *Y02T 10/7216* (2013.01); *Y02T 10/7241* (2013.01); *Y02T 90/121* (2013.01); *Y02T 90/127* (2013.01); *Y02T 90/128* (2013.01); *Y02T 90/14* (2013.01); *Y02T 90/169* (2013.01); *Y04S 10/126* (2013.01); *Y04S 30/14* (2013.01); *Y10T 307/544* (2015.04)

(58) Field of Classification Search
CPC  B60L 11/1848; B60L 11/185; B60L 2230/22; B60L 2210/10; B60L 11/1868; B60L 11/1812; B60L 2210/30; H01L 31/02021; H02J 3/32; H02J 3/381; H02J 3/383; H02J 7/007; H02J 7/35; H02J 7/1423; H02M 3/02; H02M 7/44; H02S 40/34; H02S 40/38; Y02E 10/563; Y02E 60/721; Y02E 70/30; Y02E 60/12; Y02T 10/7005; Y02T 10/7088; Y02T 10/7094; Y02T 10/7216; Y02T 10/7241; Y02T 90/121; Y02T 90/127; Y02T 90/128; Y02T 90/14; Y02T 90/169; Y02T 10/92; Y04S 10/126; Y04S 30/14; Y10T 307/544
See application file for complete search history.

(56) References Cited

U.S. PATENT DOCUMENTS

| | | | |
|---|---|---|---|
| 2011/0234150 A1* | 9/2011 | Furukawa | H02J 7/0027 320/101 |
| 2012/0049792 A1 | 3/2012 | Crombez | |
| 2012/0081071 A1* | 4/2012 | Asakura | H02J 7/0068 320/109 |
| 2012/0173034 A1 | 7/2012 | Taima | |
| 2013/0082663 A1 | 4/2013 | Mori et al. | |

FOREIGN PATENT DOCUMENTS

| | | |
|---|---|---|
| JP | S54-049731 A | 4/1979 |
| JP | 05-108176 A | 4/1993 |
| JP | 08-251818 A | 9/1996 |
| JP | H10-150733 A | 6/1998 |
| JP | 11-178241 A | 7/1999 |
| JP | 2000-224770 A | 8/2000 |
| JP | 2000-278869 A | 10/2000 |
| JP | 2002-135906 A | 5/2002 |
| JP | 2002-315193 A | 10/2002 |
| JP | 2004-048895 A | 2/2004 |
| JP | 2008-048544 A | 2/2006 |
| JP | 2006-333552 A | 12/2006 |
| JP | 2009-159692 A | 7/2009 |
| JP | 2009-278776 A | 11/2009 |
| JP | 2012-210080 A | 10/2010 |
| JP | 2010-252547 A | 11/2010 |
| JP | 2011-176963 A | 9/2011 |
| JP | 2011-177011 A | 9/2011 |
| JP | 2012-095465 A | 5/2012 |
| WO | 2007/096720 A1 | 8/2007 |
| WO | 2011/043967 A2 | 4/2011 |
| WO | 2011-162025 A1 | 12/2011 |
| WO | 2012/032947 A1 | 3/2012 |
| WO | 2012/043249 A1 | 4/2012 |

OTHER PUBLICATIONS

Yusuf Gurkaynak, et al., "Control and Power Management of a Grid Connected Residential Photovoltaic System with Plug-in Hybrid Electric Vehicle (PHEV) Load", Applied Power Electronics Conference and Exposition, Twenty-Fourth Annual IEEE, IEEE, Piscataway, NJ, USA, Feb. 15, 2009, pp. 2086-2091, XP031442983, ISBN: 978-1-4244-2811-3.
International Search Report for Application No. PCT/JP2013/003234 dated Aug. 6, 2013.

* cited by examiner

IN-VEHICLE POWER SUPPLY DEVICE

TECHNICAL FIELD

The present invention relates to a vehicle-mounted power supply apparatus that charges/discharges power of a vehicle-mounted storage battery and also relates to a photovoltaic power generating apparatus provided in a house.

BACKGROUND ART

In recent years, electric vehicles each configured to travel using a vehicle-mounted storage battery such as an EV (electric vehicle), PHEV (plug-in hybrid electric vehicle) or HEV (hybrid electric vehicle) are becoming popular. There are vehicle-mounted power supply apparatuses that charge a storage battery mounted on these electric vehicles from power supplies outside the vehicles and use electric energy stored in the storage battery outside the vehicles.

There are conventional vehicle-mounted power supply apparatuses that directly output DC electric energy stored in a vehicle-mounted storage battery to the outside of the vehicle. The DC electric energy outputted from the vehicle-mounted power supply apparatus is converted to AC electric energy by a stationary power generating apparatus installed outside the vehicle and supplied to a house or the like (e.g., PTL 1).

There are also vehicle-mounted power supply apparatuses that convert DC electric energy stored in a vehicle-mounted storage battery to DC electric energy at a voltage varying depending on power of the storage battery by a DC/DC converter and output the DC electric energy to the outside of the vehicle. The DC electric energy outputted from the vehicle-mounted power supply apparatus is used to charge another vehicle-mounted storage battery (e.g., PTL 2).

DC/DC converters can also supply a predetermined low DC voltage to drive devices operating on a low voltage such as air conditioners.

CITATION LIST

Patent Literature

PTL 1
Japanese Patent Application Laid-Open No. 2004-48895
PTL 2
Japanese Patent Application Laid-Open No. 2010-252547

SUMMARY OF INVENTION

Technical Problem

However, the vehicle-mounted power supply apparatus disclosed in PTL 1 is intended to directly output DC electric energy stored in the vehicle-mounted storage battery to the outside of the vehicle. Many batteries mounted on electric vehicles have a voltage equal to or greater than 150 V. For this reason, when DC electric energy stored in the battery is directly outputted to the outside of the vehicle, it is necessary to provide safety measures associated with high voltages outside the vehicle such as securing insulating properties of cables outside the vehicle and hiding of cables.

The function of the stationary power generating apparatus described in PTL 1 may be mounted on the vehicle so that AC electric energy equivalent to that supplied to a house or the like may be directly outputted from the vehicle, thus eliminating the need for safety measures associated with high voltages. However, this results in addition of such an apparatus to the electric vehicle, which is not desirable to the electric vehicle required to be lightweight.

The vehicle-mounted power supply apparatus disclosed in PTL 2 also performs voltage conversion using a DC/DC converter, but since the converter converts DC energy to a voltage in accordance with power of the storage battery, the voltage outputted outside the vehicle may become a high voltage. Thus, the vehicle-mounted power supply apparatus of PTL 2 requires safety measures associated with high voltages outside the vehicle as in PTL 1. The safety measures associated with high voltages refer to leakage preventive measures such as mounting of a leakage detection circuit and a circuit breaker required by laws and regulations in a vehicle, or the like associated with high voltages.

An object of the present invention is to provide a vehicle-mounted power supply apparatus and a photovoltaic power generating apparatus that secure safety without causing a considerable change in the vehicle-mounted power supply apparatus and satisfy standards required by laws and regulations associated with high voltages when outputting DC electric energy stored in a vehicle-mounted storage battery to the outside of the vehicle.

Solution to Problem

A vehicle-mounted power supply apparatus according to an aspect of the present invention includes: a storage battery mounted on a vehicle; a DC/DC converter that converts a first DC voltage outputted from the storage battery and that outputs the converted voltage as a second DC voltage; an auxiliary battery that is chargeable with the second DC voltage outputted from the DC/DC converter and that supplies power to electrical equipment mounted on the vehicle; a DC voltage outlet through which the second DC voltage outputted from the DC/DC converter is outputted to an outside of the vehicle; a switching section that outputs the second DC voltage outputted from the DC/DC converter to any one of the DC voltage outlet, and the electrical equipment as well as the auxiliary battery; and a control section that controls the DC/DC converter and the switching section, in which, when the control section controls the switching section so that the second DC voltage is outputted to the DC voltage outlet, the control section controls the DC/DC converter so that the second DC voltage becomes equal to or below a predetermined voltage value which is smaller than a rated voltage value of the storage battery.

A photovoltaic power generating apparatus according to an aspect of the present invention is a photovoltaic power generating apparatus provided in a house, the apparatus including: a DC voltage inlet that receives a DC voltage from an outside of the house as input; a photovoltaic power generating section that converts sunlight to electric energy and outputs the electric energy as a voltage; an inverter that converts the DC voltage inputted from the DC voltage inlet and the voltage outputted from the photovoltaic power generating section to an AC voltage and outputs the AC voltage; and a backflow preventing section, in which the backflow preventing section is provided between an electrical joint between the DC voltage inputted from the DC voltage inlet and the voltage outputted from the photovoltaic power generating section, and the DC voltage inlet and prevents a current from flowing in a direction from the electrical joint to the DC voltage inlet.

Advantageous Effects of Invention

According to the present invention, a DC/DC converter for charging a vehicle-mounted auxiliary battery is used by switching through a switching section, so that a DC voltage is outputted to the outside of the vehicle without causing any considerable change in the vehicle-mounted power supply apparatus, and the DC/DC converter is controlled so that the voltage value becomes equal to or below a predetermined voltage value which is smaller than a rated voltage value of the storage battery, thus exerting an effect of securing safety and satisfying standards required by laws and regulations associated with high voltages.

DESCRIPTION OF EMBODIMENTS

Figure 1:
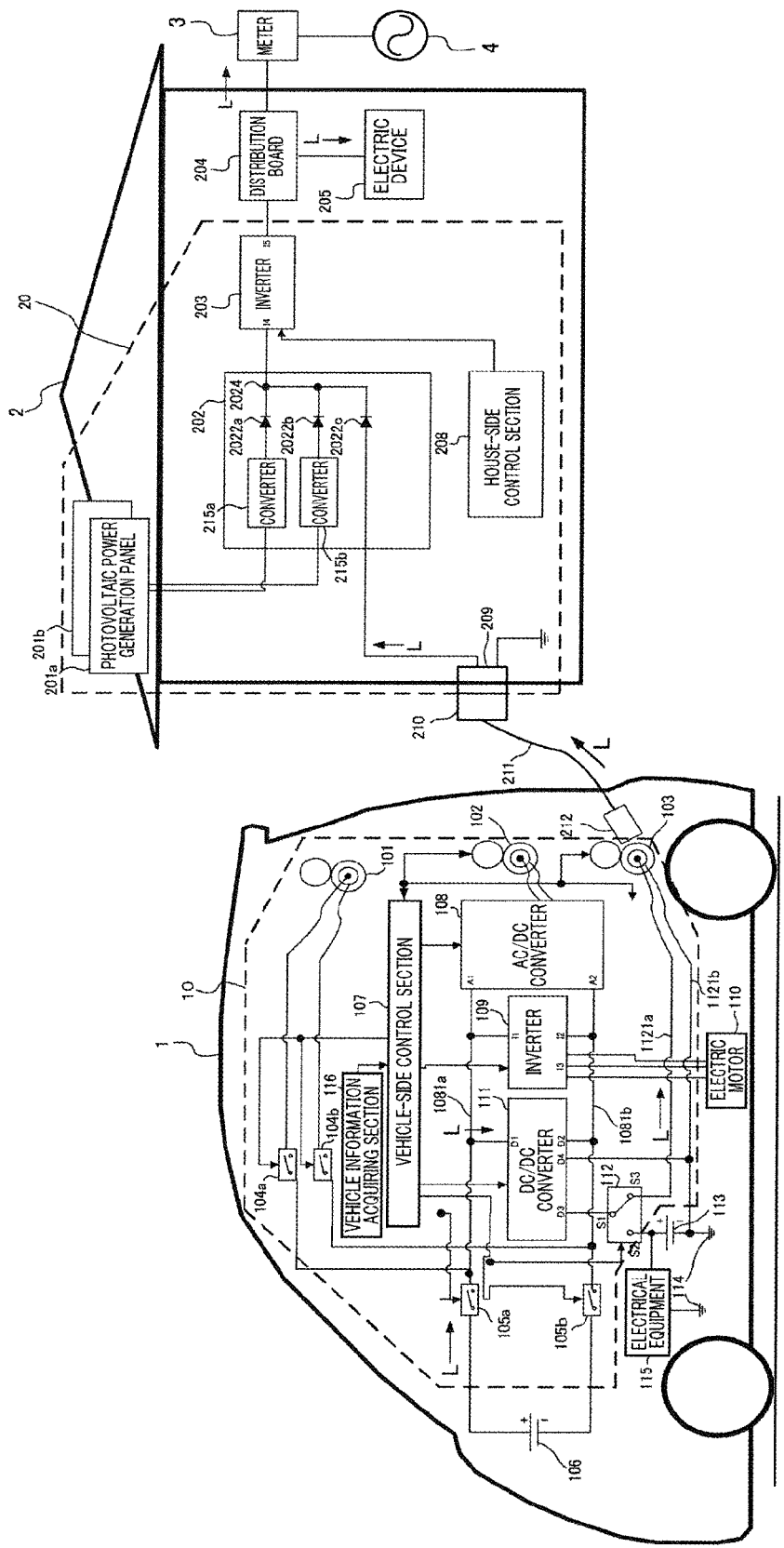
FIG. 1 is a block diagram illustrating a configuration example of a vehicle-mounted power supply apparatus and a photovoltaic power generating apparatus according to Embodiment 1 of the present invention.

Hereinafter, embodiments of the present invention will be described in detail with reference to the accompanying drawings. Among all the drawings for describing the embodiments, the same elements will be assigned the same reference numerals in principle and the redundant description thereof will be omitted.

Embodiment 1

Figure 2:
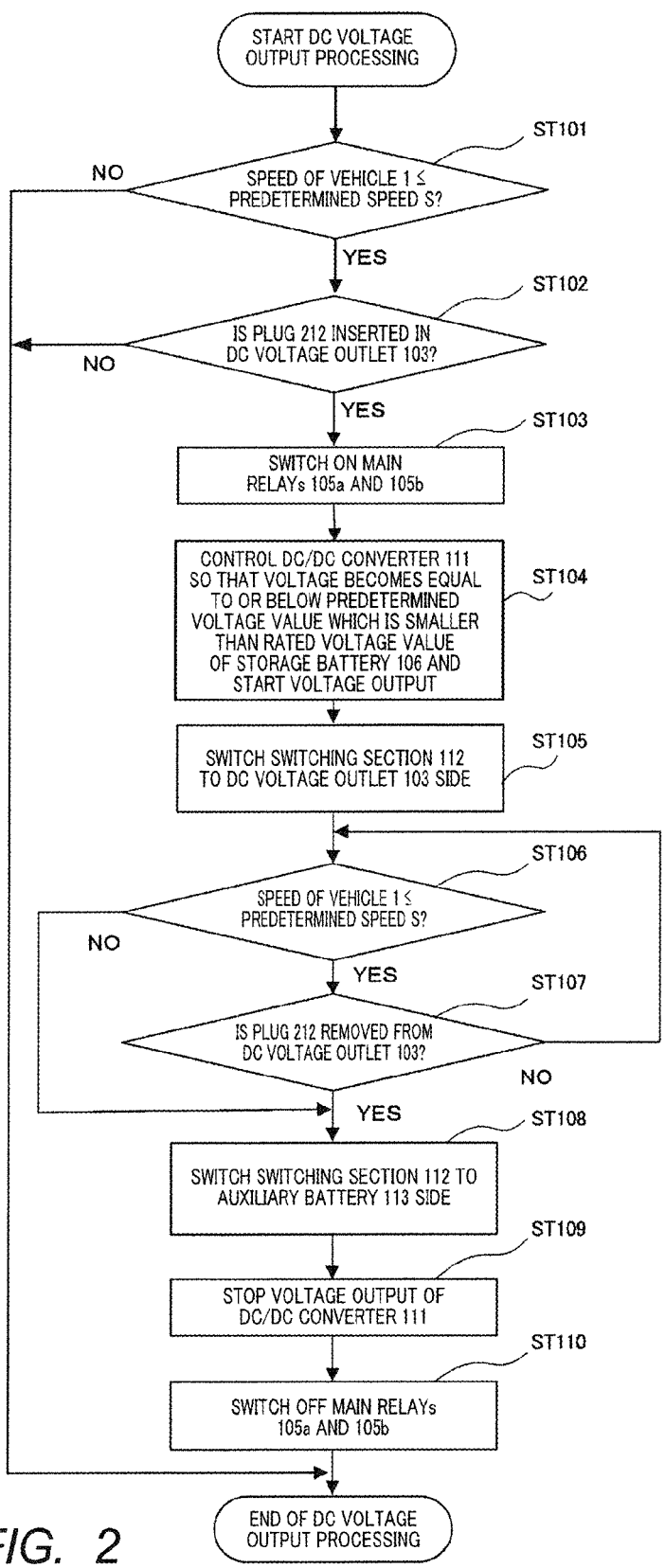
FIG. 2 is a flowchart illustrating an example of operation conducted by the vehicle-mounted power supply apparatus according to Embodiment 1 of the present invention.

Components according to Embodiment 1 of the present invention will be described with reference to FIG. 1 and FIG. 2. FIG. 1 is a block diagram illustrating a configuration example of a vehicle-mounted power supply apparatus and a photovoltaic power generating apparatus according to an embodiment of the present invention. FIG. 1 also illustrates meter 3 and commercial power supply 4 in addition to the vehicle-mounted power supply apparatus and the photovoltaic power generating apparatus. FIG. 2 is a flowchart illustrating an example of operation conducted by the vehicle-mounted power supply apparatus according to Embodiment 1 of the present invention.

Vehicle-mounted power supply apparatus 10 is mounted on vehicle 1. Vehicle 1 is an electric vehicle. The electric vehicle refers to an EV (electric vehicle), PHEV (plug-in hybrid electric vehicle) or HEV (hybrid electric vehicle) capable of running on electric energy stored in a vehicle-mounted storage battery.

Photovoltaic power generating apparatus 20 is to be installed in house 2. Photovoltaic power generating apparatus 20 is provided with a function of supplying electric energy generated by photovoltaic power generation panels 201a and 201b to electric device 205 provided in house 2.

Photovoltaic power generating apparatus 20 includes a function of supplying not only electric energy generated by photovoltaic power generation panels 201a and 201b but also at least one of electric energy supplied from commercial power supply 4 and electric energy outputted from vehicle-mounted power supply apparatus 10 to electric device 205 provided in house 2. Here, the "house" is not limited to a general domicile and thus represents a building in general that uses the electric device and is a concept that includes a habitable house such as a stand-alone house, condominium, factory, building and commercial facilities such as convenience store, shopping center. Hereinafter, the components will be described in detail.

(Configuration of Vehicle-Mounted Power Supply Apparatus)

Vehicle-mounted power supply apparatus 10 includes quick charging port 101, domestic charging port 102, DC voltage outlet 103, relay 104a, relay 104b, main relay 105a, main relay 105b, vehicle-side control section 107, AC/DC converter 108, inverter 109, DC/DC converter 111, switching section 112, and vehicle information acquiring section 116.

Vehicle-mounted power supply apparatus 10 charges or discharges storage battery 106, supplies electric energy to electric motor 110, charges or discharges auxiliary battery 113 and supplies electric energy to electrical equipment 115.

(Quick Charging Scheme)

Quick charging port 101 is a charging port for charging storage battery 106 according to a scheme of charging at a high voltage (e.g., DC 300 V) (hereinafter, referred to as "quick charging scheme"). Quick charging port 101 is connected to quick charging equipment (not shown) via a quick charging connector. DC electric energy supplied from the connected quick charging connector is supplied to storage battery 106 via relay 104a and relay 104b. Relay 104a is located in an electrical path on the power supply side of the electrical path from quick charging port 101 to storage battery 106 and is configured to electrically connect or disconnect this path. On the other hand, relay 104b is located in an electrical path on the ground side of the electrical path from quick charging port 101 to storage battery 106, and is configured to electrically connect or disconnect this path. Relay 104a and relay 104b are controlled by vehicle-side control section 107. Relay 104a and relay 104b are switched ON when storage battery 106 is charged according to the quick charging scheme and switched OFF when storage battery 106 is not charged.

Of the electrical path between relay 104a and storage battery 106, main relay 105a is provided in a path on the power supply side and main relay 105b is provided in a path on the ground side. Main relay 105a and main relay 105b are configured to electrically connect or disconnect the electrical path and are controlled by vehicle-side control section 107.

Main relay 105a and main relay 105b are electrically connected to a positive-side electrode and a negative-side electrode of storage battery 106 respectively. Vehicle-side control section 107 controls main relay 105a and main relay 105b so as to be switched ON when charging or discharging storage battery 106, and switched OFF otherwise.

(Domestic Charging Scheme)

Domestic charging port 102 is a charging port for charging storage battery 106 according to a charging scheme (hereinafter, referred to as "domestic charging scheme") using a domestic power supply (e.g., AC 100 V or AC 200 V) supplied from a domestic electric outlet. Domestic charging port 102 is connected to domestic charging equipment (not shown) and a domestic charging connector. AC electric energy supplied from the connected domestic charging connector is inputted to AC/DC converter 108 via domestic charging port 102. AC/DC converter 108 converts AC electric energy from domestic charging port 102 to DC electric energy and outputs the DC electric energy. AC/DC converter 108 is controlled by vehicle-side control section 107.

In FIG. 1, an electrical path connected to the output on the power supply side outputted from output terminal A1 of AC/DC converter 108 is called "charging power supply line 1081a." On the other hand, an electrical path connected to the output on the ground side outputted from output terminal A2 of AC/DC converter 108 is called "charging ground line 1081b." Since charging power supply line 1081a has a high voltage, charging ground line 1081b is insulated from body ground 114 to be described later.

Charging power supply line 1081a is electrically connected to the positive-side electrode of storage battery 106 via main relay 105a and charging ground line 1081b is electrically connected to the negative-side electrode of storage battery 106 via main relay 105b. When storage battery 106 is charged according to the domestic charging scheme, main relay 105a and main relay 105b are switched ON and charging is performed at the DC voltage (e.g., 300 V) outputted from AC/DC converter 108.

(Power Supply to Electric Motor)

Storage battery 106 is a storage battery having a high rated voltage (e.g., rated voltage on the order of 300 V) and is, for example, a nickel hydrogen storage battery or lithium ion storage battery. Vehicle 1 is a vehicle that can run using electric energy stored in storage battery 106. When vehicle 1 travels, vehicle-side control section 107 causes main relay 105a and main relay 105b to switch ON and causes electric energy stored in storage battery 106 to be transmitted to inverter 109.

Power supply-side input terminal (I1) of inverter 109 is connected to charging power supply line 1081a. On the other hand, ground-side input terminal (I2) of inverter 109 is connected to charging ground line 1081b. Inverter 109 converts the output of storage battery 106 to AC electric energy (e.g., PWM signal) based on the control from vehicle-side control section 107, outputs the AC electric energy from terminal (I3) and supplies power to electric motor 110. Electric motor 110 is a motor that generates a drive force to cause vehicle 1 to travel and operates on the AC electric energy outputted from inverter 109.

(Power Supply to Electrical Equipment)

The electric energy stored in storage battery 106 is also used to charge auxiliary battery 113. Auxiliary battery 113 is, for example, a lead storage battery whose rated voltage is lower than storage battery 106 (e.g., rated voltage on the order of 12 V).

When charging auxiliary battery 113, vehicle-side control section 107 switches ON main relay 105a and main relay 105b so as to transmit the electric energy stored in storage battery 106 to DC/DC converter 111.

The power supply-side input terminal (D1) of DC/DC converter 111 is connected to charging power supply line 1081a. The ground-side input terminal (D2) of DC/DC converter 111 is connected to charging ground line 1081b.

DC/DC converter 111 converts the voltage of the output (corresponding to a first DC voltage) of storage battery 106 based on the control from vehicle-side control section 107 and outputs the converted voltage from output terminals (D3 and D4) (corresponding to a second DC voltage). Since the rated voltage of auxiliary battery 113 is lower than the rated voltage of storage battery 106, vehicle-side control section 107 causes DC/DC converter 111 to step down the voltage so that a voltage that matches the rated voltage of auxiliary battery 113 is outputted.

Auxiliary battery 113 is electrically connected to the output terminal of DC/DC converter 111 via switching section 112 and can be charged with the DC voltage outputted from DC/DC converter 111.

The power supply side output terminal (D3) of DC/DC converter 111 is electrically connected to the positive-side electrode of auxiliary battery 113. The negative-side output terminal (D4) of DC/DC converter 111 is electrically connected to body ground 114. The negative-side electrode of auxiliary battery 113 is also electrically connected to body ground 114.

The electric energy stored in auxiliary battery 113 is used for a power supply to electrical equipment 115 mounted on vehicle 1. Electrical equipment 115 is an electric device that can operate on a low voltage (on the order of 12 V) such as a navigation apparatus, audio apparatus or air conditioner mounted on vehicle 1. The DC voltage outputted from DC/DC converter 111 can be used not only to charge auxiliary battery 113 but also for a direct power supply to electrical equipment 115.

(DC Voltage Output)

Vehicle-mounted power supply apparatus 10 can also output the DC electric energy (second DC voltage) outputted from DC/DC converter 111 to DC voltage outlet 103 via switching section 112. Vehicle-mounted power supply apparatus 10 can also extract electric energy from the outside of vehicle 1 via DC voltage outlet 103.

Switching section 112 has three terminals (S1, S2 and S3). Terminal S1 is connected to the power supply-side output terminal (D3) of DC/DC converter 111, terminal S2 is electrically connected to the positive-side electrode of auxiliary battery 113 and the power supply terminal of electrical equipment 115 and terminal S3 is electrically connected to an output electrode provided for DC voltage outlet 103.

The electrical path between terminal S3 and the power supply side electrode provided for DC voltage outlet 103 is power supply line 1121a for an external connection in FIG. 1. The ground side electrode provided for DC voltage outlet 103 is electrically connected to body ground 114 and this electrical path is ground line 1121b for an external connection in FIG. 1.

Switching section 112 is a switch that can switch between at least a state in which S1 and S2 are connected and a state in which S1 and S3 are connected. The switching of switching section 112 is controlled by vehicle-side control section 107.

Switching section 112 outputs the second DC voltage to one of electrical equipment 115 and auxiliary battery 113, and DC voltage outlet 103 under the control of vehicle-side control section 107. The state in which S1 and S2 are connected is a state in which the second DC voltage is outputted to electrical equipment 115 and auxiliary battery 113 and the state in which S1 and S3 are connected is a state in which the second DC voltage is outputted to DC voltage outlet 103.

When controlling switching section 112 so that the second DC voltage is outputted to DC voltage outlet 103, vehicle-side control section 107 controls DC/DC converter 111 so that the second DC voltage becomes equal to or below a predetermined voltage value which is smaller than the rated voltage value of storage battery 106. Moreover, when controlling switching section 112 so that the second DC voltage is outputted to DC voltage outlet 103, vehicle-side control section 107 can also control DC/DC converter 111 so that the second DC voltage becomes equal to or above a predetermined voltage value which is greater than the rated voltage value of auxiliary battery 113.

Vehicle information acquiring section 116 is a speed sensor that detects, for example, the speed of vehicle 1. The second DC voltage is outputted to DC voltage outlet 103h is when vehicle 1 is parked. When, for example, the speed of vehicle 1 acquired by vehicle information acquiring section 116 is a predetermined value (hereinafter, referred to as "predetermined speed S") or below, vehicle-side control section 107 determines that vehicle 1 is parked.

Note that switching section 112 may be made up of not only a mechanical switch but also a switch using a semiconductor.

(Configuration of Photovoltaic Power Generation Apparatus)

Next, photovoltaic power generating apparatus 20 provided in house 2 will be described. Photovoltaic power generating apparatus 20 is constructed of photovoltaic power generation panels 201a and 201b, connection box 202, inverter 203, house-side control section 208 and fixed connector 209 (corresponding to a DC voltage inlet).

Photovoltaic power generation panels 201a and 201b are a combination of a plurality of photovoltaic power generation modules, convert sunlight to electric energy and outputs this as a voltage (third DC voltage). The output terminals of photovoltaic power generation panels 201a and 201b are electrically connected to connection box 202.

Fixed connector 209 is a DC voltage inlet through which a DC voltage (fourth DC voltage) is inputted from the outside of house 2 and is connected to cable-side connector 210 outside house 2. Cable-side connector 210 is electrically connected to plug 212 via cable 211. When cable-side connector 210 is connected to fixed connector 209 and plug 212 is connected to DC voltage outlet 103, it is possible to supply power from vehicle-mounted power supply apparatus 10 to photovoltaic power generating apparatus 20.

That is, DC voltage outlet 103 is electrically connected to storage battery 106 mounted on vehicle 1 which can travel on electric energy. The fourth DC voltage inputted via fixed connector 209 is inputted to connection box 202.

Connection box 202 receives the third DC voltage and the fourth DC voltage as input, and outputs the sum of these voltages. An output terminal of connection box 202 is connected to an input terminal (I4) of inverter 203. Inverter 203 converts the DC voltage outputted from connection box 202 to an AC voltage and outputs the AC voltage.

Connection box 202 is constructed of diodes 2022a, 2022b and 2022c (corresponding to a backflow preventing section) and converters 215a and 215b.

The voltage (third DC voltage) outputted from the output terminal of photovoltaic power generation panel 201a is converted by converter 215a and transmitted to electrical joint 2024 via diode 2022a. An anode terminal of diode 2022a is electrically connected to an output terminal of converter 215a and a cathode terminal of diode 2022a is electrically connected to electrical joint 2024.

Moreover, the voltage (third DC voltage) outputted from the output terminal of photovoltaic power generation panel 201b is converted by converter 215b and transmitted to electrical joint 2024 via diode 2022b. An anode terminal of diode 2022b is electrically connected to an output terminal of converter 215b and a cathode terminal of diode 2022b is electrically connected to electrical joint 2024.

That is, diode 2022a is provided between electrical joint 2024 and converter 215a and functions as a backflow preventing section that prevents a current from flowing from electrical joint 2024 to converter 215a. The same applies to diode 2022b.

The amounts of power generation of photovoltaic power generation panels 201a and 201b vary depending on conditions such as solar radiation. For this reason, the third DC voltage is a DC voltage value when seen within a short period of time, but its voltage value changes over a longer period of time. Inverter 203 cannot output an AC voltage when its input voltage is lower than a predetermined voltage. When the amounts of power generation of photovoltaic power generation panels 201a and 201b are small, the output voltages of photovoltaic power generation panels 201a and 201b decrease. Thus, converter 215a and converter 215b step up these output voltages to predetermined voltages to enable inverter 203 to output an AC voltage.

The fourth DC voltage inputted via fixed connector 209 is transmitted to electrical joint 2024 via diode 2022c. An anode terminal of diode 2022c is electrically connected to fixed connector 209 and a cathode terminal of diode 2022c is electrically connected to electrical joint 2024.

Electrical joint 2024 is a joint between the path of the fourth DC voltage inputted from DC voltage outlet 103 and the paths of the voltages outputted from photovoltaic power generation panels 201a and 201b. That is, diode 2022c is provided between electrical joint 2024 and DC voltage outlet 103 and functions as a backflow preventing section that prevents a current from flowing in a direction from electrical joint 2024 to DC voltage outlet 103.

Inverter 203 converts the DC voltage outputted from connection box 202 to an AC voltage and outputs the AC voltage from an output terminal (I5). Inverter 203 is controlled from house side control section 208.

The AC voltage outputted from inverter 203 is supplied as electric energy to electric device 205 located in house 2 via distribution board 204. Furthermore, AC commercial power supply 4 connected via meter 3 is also connected to distribution board 204 and electric device 205 can receive a supply of electric energy from commercial power supply 4 as well. The AC voltage outputted from inverter 203 can also be outputted to commercial power supply 4 via distribution board 204 and meter 3 as shown by arrow L. In this case, meter 3 stores the amount of power outputted from house 2 to commercial power supply 4.

<Operation of Vehicle-Mounted Power Supply Apparatus>

Operation of vehicle-mounted power supply apparatus 10 according to Embodiment 1 of the present invention will be described using FIG. 2. FIG. 2 is a flowchart illustrating an example of operation of processing that vehicle-side control section 107 of the vehicle-mounted power supply apparatus according to Embodiment 1 outputs a DC voltage (DC voltage output processing).

When DC voltage output processing starts, vehicle-side control section 107 first determines whether the speed of vehicle 1 detected by vehicle information acquiring section 116 is equal to or below predetermined speed S (ST101). Suppose predetermined speed S is such a small value that vehicle 1 can be regarded as being parked. When ST101 is YES, vehicle 1 can be regarded as being parked.

When ST101 is YES, vehicle-side control section 107 determines whether plug 212 is inserted in DC voltage outlet 103 or not (ST102), and if plug 212 is inserted (ST102:

YES), vehicle-side control section 107 assumes that main relays 105a and 105b are switched ON (ST103).

Following ST103, vehicle-side control section 107 controls DC/DC converter 111 so that the voltage value becomes equal to or below a predetermined voltage value which is smaller than the rated voltage value of storage battery 106 and starts voltage output (ST104).

Following ST104, vehicle-side control section 107 changes switching section 112 so that the output (second DC voltage) of DC/DC converter 111 is connected to the DC voltage outlet 103 side (ST105). Through the processing in ST105, a DC voltage is outputted from DC voltage outlet 103.

Through the above-described processing, the electric energy stored in storage battery 106 is sent to house 2 as shown by arrow L in FIG. 1.

Following ST105, vehicle-side control section 107 determines whether the speed of vehicle 1 is equal to or below predetermined speed S (ST106) and whether plug 212 has been removed from DC voltage outlet 103 or not (ST107).

When the speed of vehicle 1 is equal to or below predetermined speed S (ST106: YES) and when plug 212 has not been removed from DC voltage outlet 103 (ST107: NO), vehicle-side control section 107 maintains the state of ST105 and outputs a DC voltage from DC voltage outlet 103.

When the speed of vehicle 1 becomes greater than predetermined speed S (ST106: NO) or when plug 212 has been removed from DC voltage outlet 103 (ST107: YES), vehicle-side control section 107 changes switching section 112 to the auxiliary battery 113 side (ST108), stops the voltage output of DC/DC converter 111 (ST109), causes main relays 105a and 105b to be switched OFF (ST110) and ends the processing.

Vehicle-side control section 107 executes ST108, ST109 and ST110, and can thereby stop the DC voltage output from DC voltage outlet 103.

When vehicle 1 is not parked (ST101: NO) and when plug 212 is not inserted (ST102: NO), vehicle-side control section 107 ends the processing. This is because there is no need for performing DC voltage output.

The order of ST103, ST104 and ST105 can be changed. The order of ST108, ST109 and ST110 can also be changed.

Note that in ST104, vehicle-side control section 107 can also control DC/DC converter 111 so that the output voltage of DC/DC converter 111 becomes equal to or below a predetermined voltage value which is smaller than the rated voltage value of storage battery 106 and equal to or above a predetermined voltage value which is greater than the rated voltage value of auxiliary battery 113.

Effects of Present Embodiment

The present embodiment uses DC/DC converter 111 for charging auxiliary battery 113 mounted on a normal vehicle by switching using switching section 112, and can thereby output the DC voltage to the outside of the vehicle without causing any considerable change in vehicle-mounted power supply apparatus 10.

Furthermore, controlling DC/DC converter 111 so that the output voltage of DC/DC converter 111 becomes equal to or below a predetermined voltage value which is smaller than the rated voltage value of storage battery 106 provides an effect of securing safety and satisfying the standards required by laws and regulations associated with high voltages.

The "laws and regulations associated with high voltages" here are, for example, regulations on technical standards for electrical equipment. When there is a possibility of violating a regulation, these standards require that the voltage to ground be reduced to 150 V or below. When the voltage to ground exceeds 150 V, provisions to enhance safety are required such as laying electrical circuits at a height that is not easily accessible by people or protecting the electrical circuits with an overcurrent breaker or earth leakage breaker. Suppressing the output voltage of DC/DC converter 111 to a voltage value equal to or below 150 V (e.g., on the order of 100 V) makes it possible to satisfy the standards required by laws and regulations.

Setting the output of DC/DC converter 111 to equal to or above a predetermined voltage value which is greater than the rated voltage value of auxiliary battery 113 exerts the following effects.

When the same power is transmitted using a cable, a larger current value can be reduced with a higher voltage value, so that it is thereby possible to make the cable core thinner. Setting the output of DC/DC converter 111 to be equal to or above a predetermined voltage value which is greater than the rated voltage value of auxiliary battery 113 makes it possible to make thinner the cable core of cable 211 connected to DC voltage outlet 103 and reduce the weight and cost of cable 211.

The present embodiment provides the backflow preventing section between electrical joint 2024 of the DC voltage inputted from fixed connector 209 and the DC voltages outputted from photovoltaic power generation panels 201a and 201b, and fixed connector 209, and thereby has an effect that it is possible to prevent the DC voltage outputted from photovoltaic power generation panels 201a and 201b from being transmitted to fixed connector 209 and to secure safety.

Variations of Embodiment 1

ST101 and ST106 in FIG. 2 indicate "determine whether the speed of vehicle 1 is equal to or below predetermined speed S," but the condition of being "equal to or below predetermined speed S" may also be replaced by "case where vehicle 1 gets ready to start." Here, "getting ready to start" refers to operation as a preliminary step for driving vehicle 1 such as "the key is inserted" or "the key is turned and power to accessories is switched on." Vehicle information acquiring section 116 detects whether the vehicle is ready to start or not and outputs the detection result to vehicle-side control section 107. The above-described processing is performed because when the vehicle "gets ready to start," vehicle 1 is very likely to start traveling and it is not appropriate for DC voltage outlet 103 to output a DC voltage.

Embodiment 2

Figure 3:
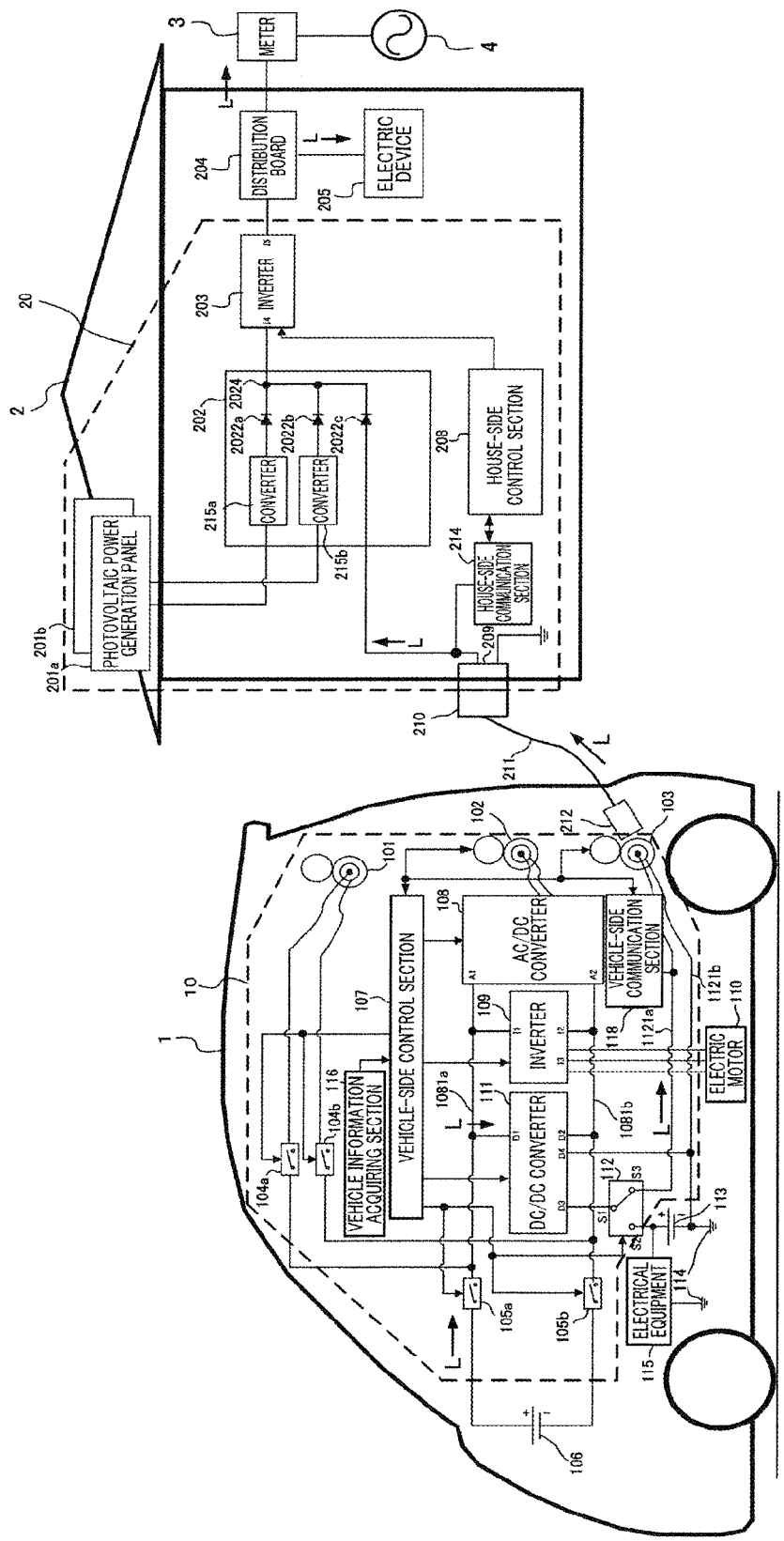
FIG. 3 is a block diagram illustrating a configuration example of a vehicle-mounted power supply apparatus and a photovoltaic power generating apparatus according to Embodiment 2 of the present invention.

Hereinafter, a vehicle-mounted power supply apparatus and a photovoltaic power generating apparatus according to Embodiment 2 of the present invention will be described with reference to the accompanying drawings. FIG. 3 is a block diagram illustrating a configuration example of the vehicle-mounted power supply apparatus and the photovoltaic power generating apparatus according to Embodiment 2 of the present invention. The elements having the same configurations as those in Embodiment 1 will be assigned the same reference numerals, the redundant description thereof will be omitted and only differences will be described in detail.

In FIG. 3, Embodiment 2 is different from Embodiment 1 in that vehicle-mounted power supply apparatus 10 is provided with vehicle-side communication section 118 that communicates with the outside of vehicle 1 and photovoltaic power generating apparatus 20 is provided with house-side communication section 214 that communicates with the outside of house 2. Vehicle-side communication section 118 is controlled by vehicle-side control section 107 and house-side communication section 214 is controlled by house side control section 208.

Vehicle-side communication section 118 and house-side communication section 214 communicate with each other via cable-side connector 210, cable 211 and plug 212, by means of power line communication.

<Operation of Vehicle-Mounted Power Supply Apparatus>

Figure 4:
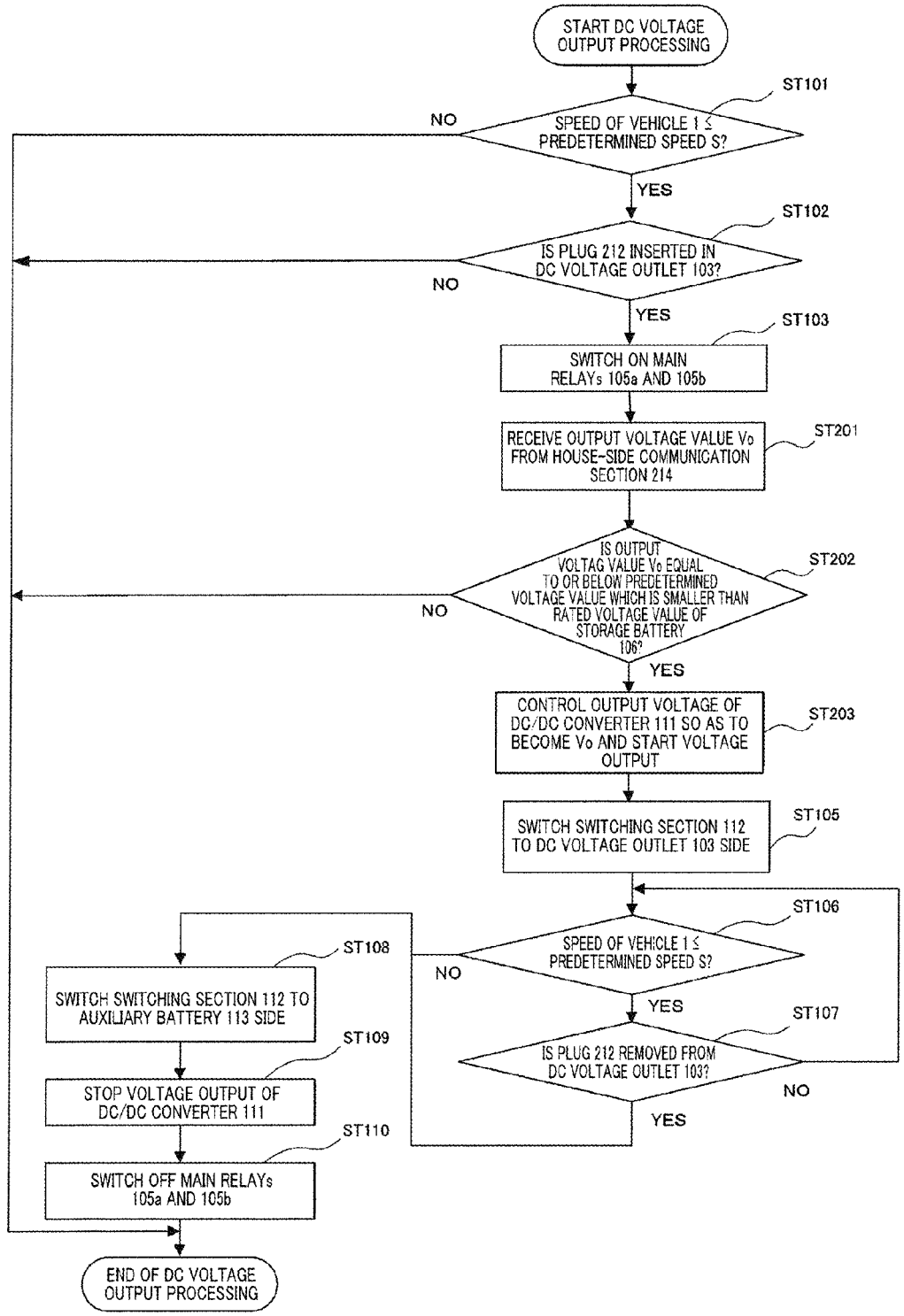
FIG. 4 is a flowchart illustrating an example of operation conducted by the vehicle-mounted power supply apparatus according to Embodiment 2 of the present invention.

Operation of vehicle-mounted power supply apparatus 10 according to Embodiment 2 of the present invention will be described with reference to FIG. 4. FIG. 4 is a flowchart illustrating an example of operation when vehicle-side control section 107 of the vehicle-mounted power supply apparatus according to Embodiment 2 performs processing of outputting a DC voltage (DC voltage output processing). FIG. 4 is different from FIG. 2 described in Embodiment 1 in that processing in ST201, ST202 and ST203 is performed instead of the processing in ST107. Hereinafter, differences from FIG. 2 will be described.

Vehicle-side control section 107 receives output voltage value Vo from house-side communication section 214 via vehicle-side communication section 118 (ST201). Output voltage value Vo is a parameter for setting the value of an output voltage (second DC voltage) of DC/DC converter 111 from the outside of vehicle 1.

Following ST201, vehicle-side control section 107 determines whether or not output voltage value Vo is equal to or below a predetermined voltage value which is smaller than the rated voltage value of storage battery 106 (ST202). When output voltage value Vo is equal to or below the predetermined voltage value which is smaller than the rated voltage value of storage battery 106 (ST20: YES), vehicle-side control section 107 controls the output voltage of DC/DC converter 111 so as to be Vo and starts voltage output (ST203). Here, the predetermined voltage value smaller than the rated voltage value of storage battery 106 refers to, for example, a voltage value equal to or below 150 V (e.g., on the order of 100 V).

When ST202 results in NO, vehicle-side control section 107 ends the processing without performing output of DC/DC converter 111. This is because outputting a voltage higher than the rated voltage value of storage battery 106 may cause a problem of safety assurance.

Note that the order of ST103, ST201 to ST203 and ST105 can be changed.

<Operation of Photovoltaic Power Generation Apparatus>

House-side control section 208 transmits, via house-side communication section 214, a voltage value to be inputted from the outside of house 2 via fixed connector 209 to vehicle-side communication section 118.

Here, the voltage value to be inputted via fixed connector 209 is a degree of a voltage value that enables inverter 203 to output an AC voltage. This voltage value substantially matches the output voltages of converter 215a and converter 215b as described in Embodiment 1. By so doing, it is possible to substantially match the voltage values at electrical joint 2024 and output the voltage values to inverter 203.

Effects of Present Embodiment

In addition to the effects described in Embodiment 1, the present embodiment exerts an effect that it is possible to set a voltage value necessary in house 2 from the photovoltaic power generating apparatus 20 side. For example, as described above, it is possible to set a voltage value that enables inverter 203 to output an AC voltage from photovoltaic power generating apparatus 20 to vehicle-mounted power supply apparatus 10.

Embodiment 3

Figure 5:
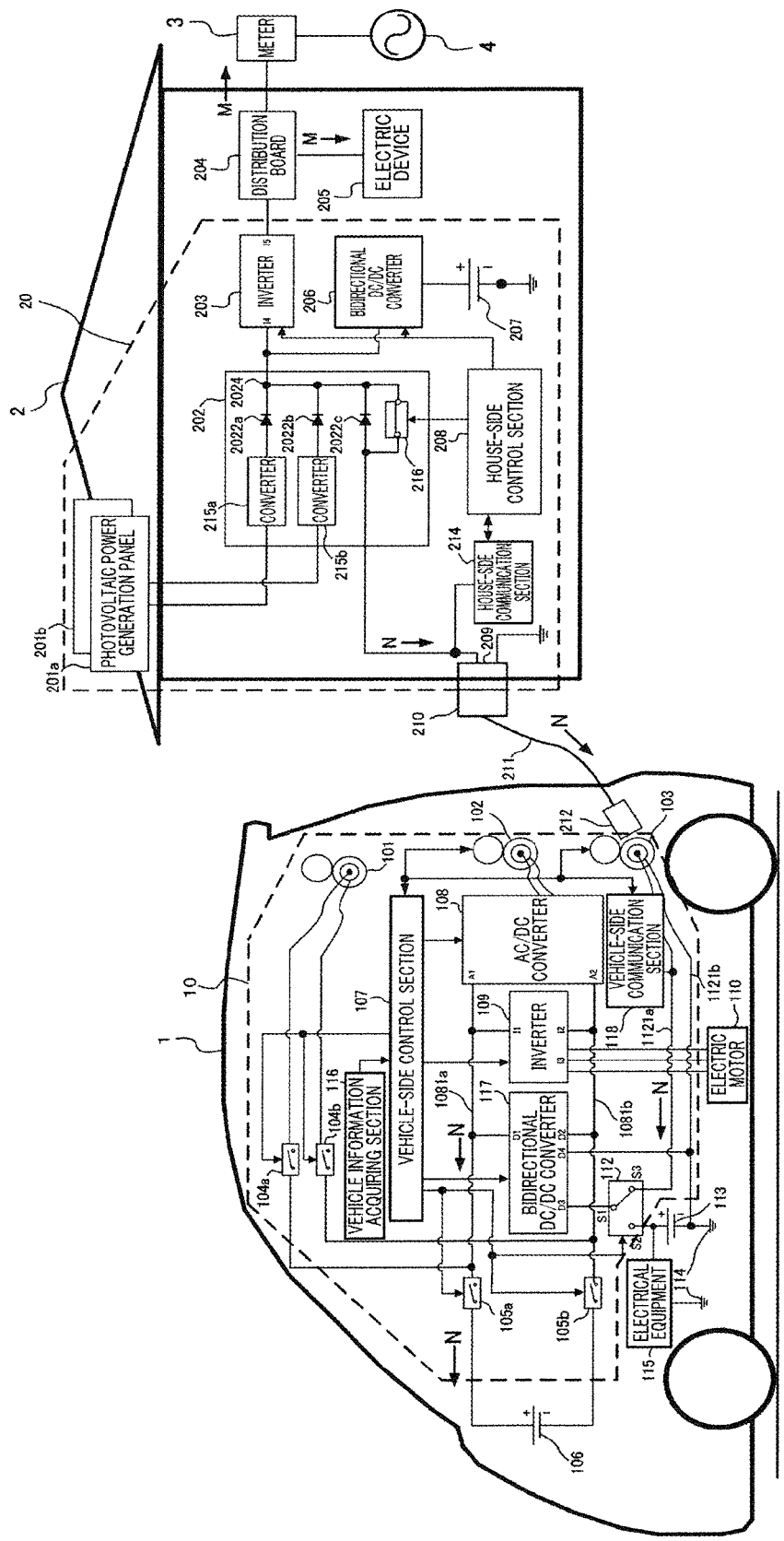
FIG. 5 is a block diagram illustrating a configuration example of a vehicle-mounted power supply apparatus and a photovoltaic power generating apparatus according to Embodiment 3 of the present invention.

Hereinafter, a vehicle-mounted power supply apparatus and a photovoltaic power generating apparatus according to Embodiment 3 of the present invention will be described with reference to the accompanying drawings. FIG. 5 is a block diagram illustrating a configuration example of the vehicle-mounted power supply apparatus and the photovoltaic power generating apparatus according to Embodiment 3 of the present invention. Elements having the same configurations as those in Embodiments 1 and 2 will be assigned the same reference numerals, description thereof will be omitted and only differences will be described in detail.

In FIG. 5, Embodiment 3 is different from Embodiment 1 in that DC/DC converter 111 is replaced by bidirectional DC/DC converter 117 capable of voltage conversion not in a single direction but in two directions, and that photovoltaic power generating apparatus 20 is provided with bidirectional DC/DC converter 206, domestic storage battery 207 and bypass relay 216.

An input/output terminal (D5) of bidirectional DC/DC converter 206 is connected to electrical joint 2024 and an input/output terminal (D6) is connected to a positive-side electrode of domestic storage battery 207. Bidirectional DC/DC converter 206 converts the voltage of the input/output terminal (D5) and outputs the converted voltage from the input/output terminal (D6) as a fifth DC voltage.

Domestic storage battery 207 is a storage battery chargeable with the fifth DC voltage, and is, for example, a nickel hydrogen storage battery or a lithium ion storage battery having a rated voltage, for example, on the order of 100 V. The negative-side electrode of domestic storage battery 207 is grounded. Electric energy generated by photovoltaic power generation panels 201a and 201b, and electric energy inputted from vehicle-mounted power supply apparatus 10 via fixed connector 209 can be stored in domestic storage battery 207.

Bidirectional DC/DC converter 206 can also convert the voltage of domestic storage battery 207 inputted to input/output terminal (D6) and output the converted voltage from the input/output terminal (D5). The electric energy outputted from input/output terminal (D5) is converted to an AC voltage by inverter 203. The electric energy outputted from the input/output terminal (D5) can be outputted to fixed connector 209 via bypass relay 216.

Bypass relay 216 is inserted at a position to electrically be switched ON or OFF between the anode side and the cathode side of diode 2022c and controlled by house-side control section 208. When bypass relay 216 is switched ON, electrical joint 2024 and fixed connector 209 are electrically connected. Bidirectional DC/DC converter 206, inverter 203 and bypass relay 216 are controlled by house-side control section 208.

The electric energy outputted from fixed connector 209 is transmitted to bidirectional DC/DC converter 117 via cable-side connector 210, cable 211, plug 212, DC voltage outlet 103, power supply line for external connection 1121*a* and switching section 112 as shown by arrow N.

Bidirectional DC/DC converter 117 can convert the DC voltage inputted from DC voltage outlet 103 and output the converted voltage. The output terminal of bidirectional DC/DC converter 117 is connected to storage battery 106 and can charge storage battery 106 as shown by arrow N. Vehicle-side control section 107 and house-side control section 208 can communicate with each other via vehicle-side communication section 118 and house-side communication section 214.

Effects of Present Embodiment

In addition to the effects described in Embodiments 1 and 2, the present embodiment can exert the following effects. The provision of domestic storage battery 207 allows electric energy generated by the photovoltaic power generation panels to be stored. The provisions of bypass relay 216 and bidirectional DC/DC converter 117 allow storage battery 106 mounted on vehicle-mounted power supply apparatus 10 to be charged from photovoltaic power generating apparatus 20.

Embodiment 4

Figure 6:
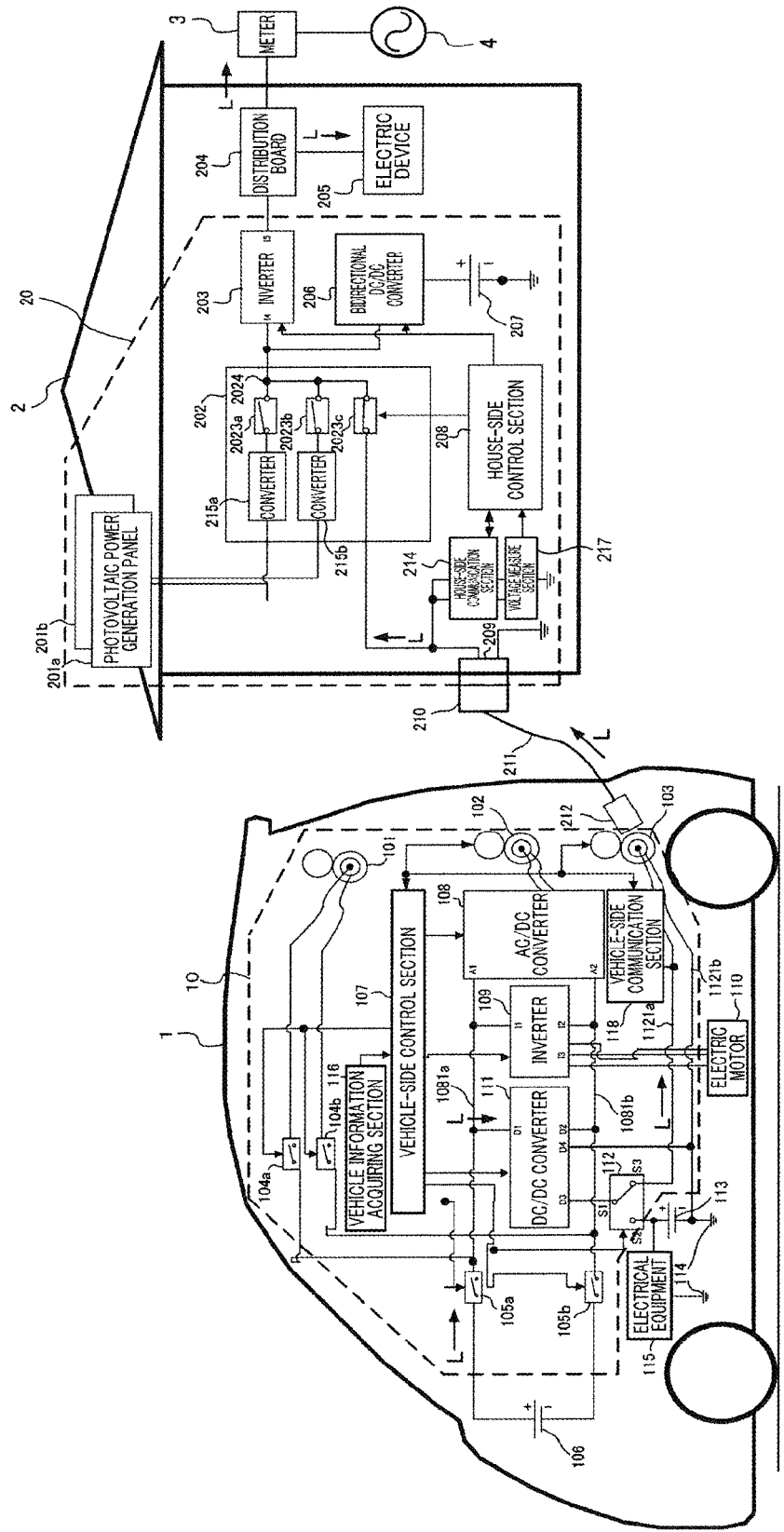
FIG. 6 is a block diagram illustrating a configuration example of a vehicle-mounted power supply apparatus and a photovoltaic power generating apparatus according to Embodiment 4 of the present invention.

Hereinafter, a vehicle-mounted power supply apparatus and a photovoltaic power generating apparatus according to Embodiment 4 of the present invention will be described with reference to the accompanying drawings. FIG. 6 is a block diagram illustrating a configuration example of the vehicle-mounted power supply apparatus and the photovoltaic power generating apparatus according to Embodiment 4 of the present invention. The elements having the same configurations as those in Embodiments 1 to 3 will be assigned the same reference numerals, description thereof will be omitted and differences will be described in detail.

In FIG. 6, Embodiment 4 is different from Embodiment 1 in that relays 2023*a*, 2023*b* and 2023*c* are provided instead of diodes 2022*a*, 2022*b* and 2022*c*, and voltage measuring section 217 that measures a voltage value inputted from fixed connector 209 is provided. Relays 2023*a*, 2023*b* and 2023*c* correspond to the backflow preventing section.

Relays 2023*a*, 2023*b* and 2023*c* are relays capable of switching ON or OFF electric energy and are controlled by house-side control section 208.

When the voltage value measured by voltage measuring section 217 is equal to or below a predetermined voltage value, house-side control section 208 switches OFF relay 2023*c*. The predetermined voltage value is set to such a small value that makes it possible to determine the presence or absence of a voltage supply from the outside of house 2. When relay 2023*c* is switched OFF, house-side control section 208 switches ON relay 2023*a* and relay 2023*b* so that the outputs of photovoltaic power generation panels 201*a* and 201*b* are transmitted to inverter 203.

When the voltage value measured by voltage measuring section 217 is greater than the predetermined voltage value, house-side control section 208 switches ON relay 2023*c* and switches OFF relay 2023*a* and relay 2023*b*. This causes electric energy inputted from fixed connector 209 to be transmitted to inverter 203.

Variation of Embodiment 4

It is described above that when the voltage value measured by voltage measuring section 217 is greater than the predetermined voltage value, relay 2023*a* and relay 2023*b* are switched OFF, but house-side control section 208 may cause the output voltage value of DC/DC converter 111 to substantially match the output voltage values of converters 215*a* and 215*b* via house-side communication section 214 to thereby switch ON all relays 2023*a*, 2023*b* and 2023*c*. This is because the voltage values substantially match at electrical joint 2024, thus preventing the possibility of backflow.

Effects of Present Embodiment

The present embodiment switches OFF relay 2023*c* when no voltage is supplied to fixed connector 209 from the outside of house 2 and thereby prevents the DC voltages outputted from photovoltaic power generation panels 201*a* and 201*b* from being transmitted to fixed connector 209, exerting an effect of securing safety.

Embodiment 5

Figure 7:
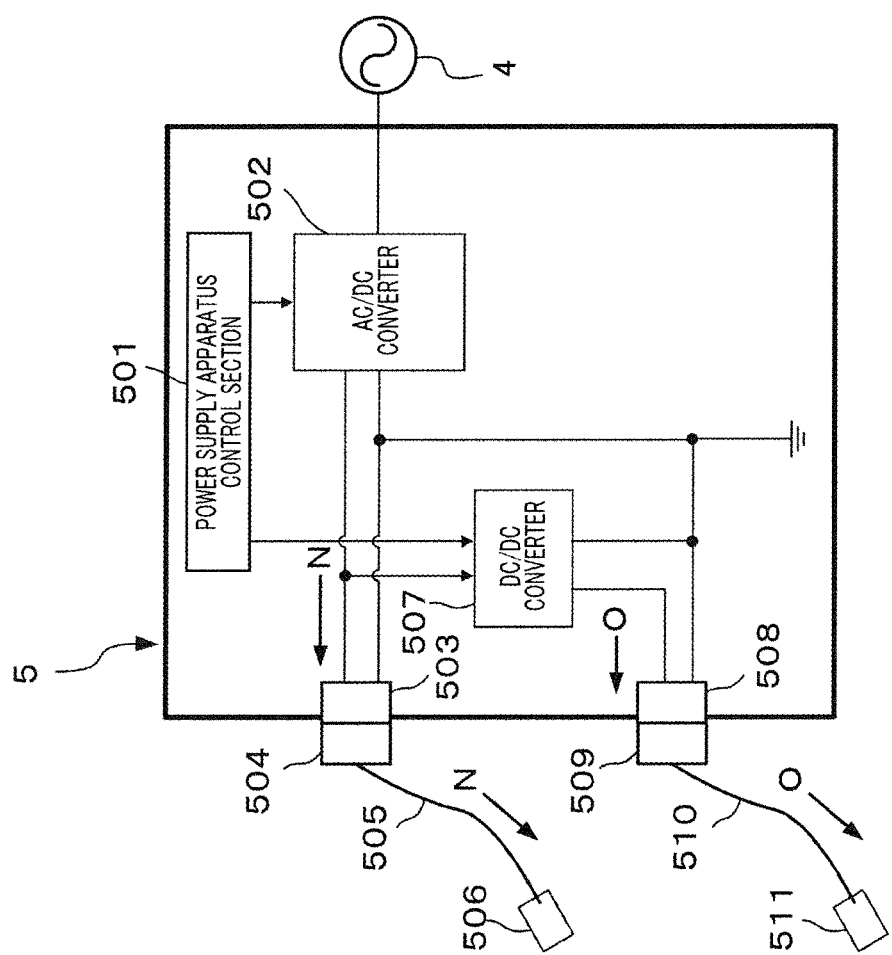
FIG. 7 is a block diagram illustrating a configuration example of a power supply apparatus according to Embodiment 5 of the present invention.

Hereinafter, a power supply apparatus according to Embodiment 5 of the present invention will be described with reference to the accompanying drawings. FIG. 7 is a block diagram illustrating a configuration example of the power supply apparatus according to Embodiment 5 of the present invention. The elements having the same configurations as those in Embodiments 1 to 4 will be assigned the same reference numerals, the redundant description thereof will be omitted and differences will be described in detail.

Power supply apparatus 5 is a power supply apparatus that supplies power to vehicle 1 in FIG. 1 and includes power supply apparatus control section 501, AC/DC converter 502, fixed connector 503, cable-side connector 504, cable 505, plug 506, DC/DC converter 507, fixed connector 508, cable-side connector 509, cable 510 and plug 511.

Power supply apparatus control section 501 controls AC/DC converter 502 and DC/DC converter 507.

AC/DC converter 502 converts AC electric energy outputted from commercial power supply 4 to DC electric energy and outputs the DC electric energy. The DC electric energy outputted from AC/DC converter 502 is outputted from fixed connector 503 (arrow N). Cable-side connector 504 is connected to fixed connector 503. Plug 506 is connected to cable-side connector 504 via cable 505. Plug 506 is connected to, for example, quick charging port 101 of vehicle 1 in FIG. 1 and can charge storage battery 106 according to a quick charging scheme.

The DC electric energy outputted from AC/DC converter 502 is inputted to DC/DC converter 507, voltage-converted by DC/DC converter 507 and outputted to plug 511 via fixed connector 508, cable-side connector 509 and cable 510 in that order (arrow O).

Power supply apparatus control section 501 controls, for example, the voltage value outputted from DC/DC converter 507 so as to become a predetermined voltage value (e.g., 100 V) smaller than the voltage value outputted from fixed connector 503. Plug 511 is used to supply electric energy to a device such as electric motorcycle operating on a relatively low voltage.

Effects of Present Embodiment

If the predetermined voltage value is assumed to be a voltage value which is equal to or below 150 V (e.g., on the order of 100 V) as with Embodiment 1, it is possible to satisfy the standards required by laws and regulations. That is, by controlling the voltage value outputted from DC/DC converter 507 so as to become a predetermined voltage value, it is possible to exert an effect of eliminating the need for safety measures associated with high voltages outside the power supply apparatus.

Variation Common to All Embodiments

In above Embodiments 1 to 5, charging using DC electric energy is sufficient for "quick charging" and charging using AC electric energy is sufficient for "domestic charging," and "quick" and "domestic" are expressions of convenience.

Switching section 112, bypass relay 216, relay 2023a, relay 2023b and relay 2023c according to above Embodiments 1 to 5 need only to be able to switch ON/OFF power, and mechanical switches or semiconductor switches may also be used.

The disclosures of the specifications, drawings, and abstracts included in Japanese Patent Applications No. 2012-119668 and No. 2012-119669 both filed on May 25, 2012, are incorporated herein by reference in their entireties.

INDUSTRIAL APPLICABILITY

The vehicle-mounted power supply apparatus and photovoltaic power generating apparatus according to the present invention are suitable for use, when outputting DC electric energy stored in a vehicle-mounted storage battery to the outside of the vehicle, in securing safety without causing a considerable change in the vehicle-mounted power supply apparatus and also in satisfying standards required by laws and regulations associated with high voltages.

REFERENCE SIGNS LIST

1 Vehicle
10 Vehicle-mounted power supply apparatus
101 Quick charging port
102 Domestic charging port
103 DC voltage outlet
104a, 104b Relay
105a, 105b Main relay
106 Storage battery
107 Vehicle-side control section
108 AC/DC converter
1081a Charging power supply line
1081b Charging ground line
109 Inverter
110 Electric motor
111 DC/DC converter
112 Switching section
1121a Power supply line for external connection
1121b Ground line for external connection
113 Auxiliary battery
114 Body ground
115 Electrical equipment
116 Vehicle information acquiring section
117 Bidirectional DC/DC converter
118 Vehicle-side communication section
2 House
20 Photovoltaic power generating apparatus
201a, 201b Photovoltaic power generation panel
202 Connection box
2022a, 2022b, 2022c Diode (backflow preventing section)
2023a, 2023b, 2023c Relay (backflow preventing section)
2024 Electrical joint
203 Inverter
204 Distribution board
205 Electric device
206 Bidirectional DC/DC converter
207 Domestic storage battery
208 House-side control section
209 Fixed connector
210 Cable-side connector
211 Cable
212 Plug
214 House-side communication section
215a, 215b Converter
216 Bypass relay
217 Voltage measuring section
3 Meter
4 Commercial power supply
5 Power supply apparatus
501 Power supply apparatus control section
502 AC/DC converter
503 Fixed connector
504 Cable-side connector
505 Cable
506 Plug
507 DC/DC converter
508 Fixed connector
509 Cable-side connector
510 Cable
511 Plug

The invention claimed is:

1. A vehicle-mounted power supply apparatus comprising:
   a DC/DC converter that converts a first DC voltage outputted from a vehicle-mounted storage battery into a second DC voltage and that outputs the second DC voltage;
   a switching section that selectively outputs the second DC voltage outputted from the DC/DC converter to any one of an auxiliary battery mounted on the vehicle or a DC voltage outlet through which the second DC voltage is outputted to an outside of the vehicle; and
   a control section that controls the DC/DC converter and the switching section, wherein
   the DC/DC converter, the switching section, the control section, the DC voltage outlet, the storage battery, and the auxiliary battery are mounted on the vehicle,
   when the control section controls the switching section so that the second DC voltage is outputted to the DC voltage outlet, the control section controls the DC/DC converter so that the second DC voltage becomes equal to or below a predetermined voltage value which is smaller than a rated voltage value of the storage battery.

2. The vehicle-mounted power supply apparatus according to claim 1, further comprising the DC voltage outlet.

3. The vehicle-mounted power supply apparatus according to claim 1, wherein, when the control section controls the switching section so that the second DC voltage is outputted to the DC voltage outlet, the control section controls the DC/DC converter so that the second DC voltage becomes equal to or above a predetermined voltage value which is greater than a rated voltage value of the auxiliary battery.

4. The vehicle-mounted power supply apparatus according to claim 1, wherein:

the DC/DC converter is a bidirectional DC/DC converter;

the DC/DC converter converts the DC voltage inputted from the outside of the vehicle via the DC voltage outlet and outputs the converted DC voltage; and the storage battery is chargeable with the output of the DC/DC converter.

5. The vehicle-mounted power supply apparatus according to claim 1, further comprising a speed sensor that detects a speed of the vehicle, wherein, when the control section determines based on a signal of the speed sensor that the vehicle is not in movement, the control section controls the switching section so that the second DC voltage is outputted to the DC voltage outlet.

6. The vehicle-mounted power supply apparatus according to claim 1, wherein the control section further detects whether a plug is inserted from the outside of the vehicle into the DC voltage outlet, and controls, upon detecting that the plug is inserted, the switching section so that the second DC voltage is outputted to the DC voltage outlet.

7. The vehicle-mounted power supply apparatus according to claim 1, further comprising a vehicle-side communication section that communicates with the outside of the vehicle, wherein the control section receives a voltage value of the second DC voltage from the outside of the vehicle via the vehicle-side communication section.

8. The vehicle-mounted power supply apparatus according to claim 1, wherein:

the rated voltage value of the storage battery is greater than a rated voltage value of the auxiliary battery; and the DC/DC converter steps down the first DC voltage outputted from the storage battery and outputs the voltage as the second DC voltage.

9. The vehicle-mounted power supply apparatus according to claim 1, wherein the storage battery is a nickel hydrogen storage battery or lithium ion storage battery, and the auxiliary battery is a lead storage battery.

10. The vehicle-mounted power supply apparatus according to claim 1, wherein the vehicle is a vehicle configured to travel on electric energy stored in the storage battery.

* * * * *